United States Patent
Zan et al.

(10) Patent No.: US 12,019,960 B1
(45) Date of Patent: Jun. 25, 2024

(54) METHOD FOR CONSTRUCTING SIX-DEGREE-OF-FREEDOM ROV OPERATION SIMULATION PLATFORM

(71) Applicant: HARBIN ENGINEERING UNIVERSITY, Harbin (CN)

(72) Inventors: Yingfei Zan, Harbin (CN); Ruinan Guo, Harbin (CN); Lihao Yuan, Harbin (CN); Duanfeng Han, Harbin (CN)

(73) Assignee: HARBIN ENGINEERING UNIVERSITY, Harbin (CN)

( * ) Notice: Subject to any disclaimer, the term of this patent is extended or adjusted under 35 U.S.C. 154(b) by 0 days.

(21) Appl. No.: 18/494,936

(22) Filed: Oct. 26, 2023

Related U.S. Application Data

(63) Continuation of application No. PCT/CN2023/102322, filed on Jun. 26, 2023.

(51) Int. Cl.
*G06F 30/23* (2020.01)
*G05B 17/02* (2006.01)
*G06F 30/15* (2020.01)

(52) U.S. Cl.
CPC ............. *G06F 30/23* (2020.01); *G05B 17/02* (2013.01); *G06F 30/15* (2020.01)

(58) Field of Classification Search
CPC ...... G06F 30/25; G06F 30/367; G06F 30/398; G06F 2111/00; G06F 2119/22; G06F 30/23; G06F 30/15; G05B 17/02
See application file for complete search history.

(56) References Cited

U.S. PATENT DOCUMENTS

| | | | |
|---|---|---|---|
| 2015/0088346 A1* | 3/2015 | Lee | B63B 79/00 356/32 |
| 2015/0246711 A1* | 9/2015 | Lee | B63B 21/50 405/224 |
| 2019/0233070 A1* | 8/2019 | Hartland | G01V 1/3843 |

FOREIGN PATENT DOCUMENTS

CN 107479601 A * 12/2017 ............... B66D 1/08

OTHER PUBLICATIONS

H. Zhou, J. Cao, B. Yao, L. Lian, "Hierarchical NMPC-ISMC of active heave motion compensation system TMS-ROV recovery", pp. 1-16, 2021. (Year: 2021).*

(Continued)

*Primary Examiner* — Kibrom K Gebresilassie
(74) *Attorney, Agent, or Firm* — CBM PATENT CONSULTING, LLC

(57) ABSTRACT

A method for constructing a six-degree-of-freedom ROV operation simulation platform comprises an integrated control platform, an instructor control system, a marine environment simulation system, a simulation platform calculation system, an ROV control system, a display system and a database storage system; wherein the construction method comprises (1) calculating a hydrodynamic coefficient and a time delay function of a mother ship according to a profile of the mother ship; (2) establishing a finite difference model of umbilical cables and tethers by adopting a beam model, and calculating a shape and tensions at both ends; step (3) establishing boundary conditions of the umbilical cables and the tethers in a coupling model; (4) modeling a tether management system by using a bar element model; (5) establishing a nonlinear ROV maneuverability equation; and (6) establishing a dynamic model of the manipulator considering a pose of the ROV.

3 Claims, 5 Drawing Sheets

(56) References Cited

OTHER PUBLICATIONS

English translation of CN-107479601-A (Year: 2017).*

Zan Yingfei, et al., in the autonomous return control of ROV in a narrow underwater environment Journal of IntelligentSystems, vol. 17, Issue 4, p. 744-751 Publication date: Aug. 25, 2022.

Zhai Xuqiang, et al., underwater plankton crawling Type 11 robotstructure design and researchstudycarefully Automation in ManufacturingIndustry, vol. 43,issue 5, p. 41-45 Pubication date: Jun. 21, 2021.

Su tan Azhary et al., Design A Web page Online Open:https://iee exploreieee .org /stamp /stamp .jsp ?tp=&arnumber =9807777 p. 1-6 Pubication date: Jul. 25, 2022.

* cited by examiner

METHOD FOR CONSTRUCTING SIX-DEGREE-OF-FREEDOM ROV OPERATION SIMULATION PLATFORM

CROSS-REFERENCE TO RELATED APPLICATIONS

This application is the U.S. continuation application of International Application No. PCT/CN2023/102322 filed on 26 Jun. 2023 which designated the U.S. and claims priority to Chinese Application No. CN202310068820.3 filed on 6 Feb. 2023, the entire contents of each of which are hereby incorporated by reference.

TECHNICAL FIELD

The invention relates to a method for constructing a six-degree-of-freedom ROV operation simulation platform, and belongs to the field of ships.

BACKGROUND

Since ocean is an important reserve base for modern oil and gas resources, reserves of offshore oil and gas resources have increased by more than two times from shallow water, deep water to ultra-deep water, and the development of deep-water and ultra-deep water oil and gas resources has gradually become a global focus. The use of oil production and storage devices puts forward higher requirements. Remote operated vehicle (ROV) plays an important role in the installation and use of offshore structures and devices. ROV is responsible for observing an installation status, inspecting an installation area, releasing and recovering tethers during installation phases of the structures and device and responsible for monitoring underwater devices and operating deep water underwater devices during the production process. Due to the complex underwater environment, it has become a major problem to safely and efficiently control ROVs and complete tasks. In order to improve operating efficiency and reduce a risk of device damage, the present invention invented a simulation platform for a six-degree-of-freedom ROV operating system.

Existing ROV simulation and operation simulation systems have the following deficiencies:
1. Limitations of operating scenarios: in a simulation module of the existing system, an ROV and a local operating environment are main body for ROV simulation and control. The operating scenarios are limited to the ROV and surrounding waters of the ROV, while actual ROV operations comprise various structures in both water surface and underwater scenarios.
2. Lack of influencing factors for ROV operations: factors affecting ROV operations in the existing ROV simulation and operation simulation systems only comprise cables, manipulators, and sea currents, but in actual operations, ROV operating systems also comprise mother ships, umbilical cables, and tether management systems (TMS) and tethers, environmental factors also comprise waves and winds encountered by a mother ship, and currents encountered by a repeater.
3. Unrealistic ROV motion response: due to the lack of factors such as water surface scene, mother ship and TMS in the existing ROV simulation and operation simulation systems, it is impossible to simulate influences of movement in wind and waves of the mother ship on the underwater TMS and ROV.
4. Hydrodynamic coefficients of ROV deployment depend on structure forms of ROV and TMS. The existing research seldom considers dynamics of complex structures, and hydrodynamic parameters applied to simulation cannot consider hydrodynamic interactions of local components of the complex structures, so that an effective time domain modeling and limit sea state estimation method considering complex forms of structures are lacked.

SUMMARY

Object of the present invention: in order to overcome the deficiencies in the prior art, the present invention provides a method for constructing a six-degree-of-freedom ROV operation simulation platform, which can not only realistically reflect a six-degree-of-freedom motion of the ROV, but also realistically simulate influences of a surface mother ship, umbilical cables and a manipulator on an ROV operation system consisting of the surface mother ship, the umbilical cables and the manipulator.

Aiming at the deficiencies in the prior art, an overall solution of the present invention is realized as follows:
1. establishing a marine environment simulation system comprising a sea wind module, a sea wave module and a sea current module to simulate water surface scenes, which comprising: an average wind velocity, a significant wave height, a characteristic period, a current velocity distribution, and the like, which provides parameters for the calculation of wind, wave and current loads of various underwater structures;
2. establishing a mathematical model of the mother ship, a finite difference model of tethers and umbilical cables based on a beam model, and a dynamic model of a tether management system based on an element model, and the above mathematical models can calculate the wind, wave and current loads of each structure; and establishing a simulation platform calculation system to calculate motions and forces of the mother ship, a TMS and the cables; and
3. coupling the umbilical cables and the tethers with the mother ship and the ROV through kinematics and dynamic boundary conditions, simulating influences of motions of the ship and the TMS on ROV navigation and operation, and improving authenticity of ROV operation simulation.

Beneficial effects: advantages of the present invention compared with the prior art are as follows:
1. The six-degree-of-freedom ROV operation simulation platform of the present invention comprises an integrated control platform, an instructor control system, a marine environment simulation system, a simulation platform calculation system, an ROV manipulation system and a display system to form a complete ROV operation simulation system, which can meet requirements of teaching, coupling system research, ROV simulation experiments and ROV operation training.
2. The marine environment simulation system of the present invention comprises a sea wind module, a sea wave module, and a sea current module to realize a real, complex and random marine environment simulation, restore multi-body motion coupling during ROV underwater operations, which is close to the actual ROV underwater operations situation and solve a problem of poor training effect.
3. The simulation platform calculation system of the present invention comprises a main control module, a mother ship simulation module, an umbilical cable simulation module, an ROV simulation module and a manipulator simulation module to realize simulation of multiple mutually coupled objects in ROV operations.
4. The simulation platform calculation system of the present invention calculates the motion of the six-degree-of-freedom of the ROV based on a maneuverability model comprising nonlinear asymmetric hydrodynamics, and more accurately reflects influences of asymmetric geometry of the ROV on a hydrodynamic characteristic thereof, which improves accuracy of ROV motion simulation.
5. The complex TMS and ROV are discretized with rod elements in the same size to simulate deployment and recovery process. Each rod element has hydrodynamic coefficients of a structure, comprising a drag coefficient and an inertial force coefficient. Considering a change of the structure coefficient with an immersion depth and motion frequency, hydrodynamic forces such as a wave force, a resistance and a slamming force of the rod element are calculated by a Morrison equation, and a motion of the structure is calculated by a time-domain dynamic model. The method takes into account the interferences of the immersion depth and construction on local or global hydrodynamics, and more accurately calculates time-frequency dynamic responses of the TMS and the ROV in the process of gradually entering water.

DETAILED DESCRIPTION

Figure 1:
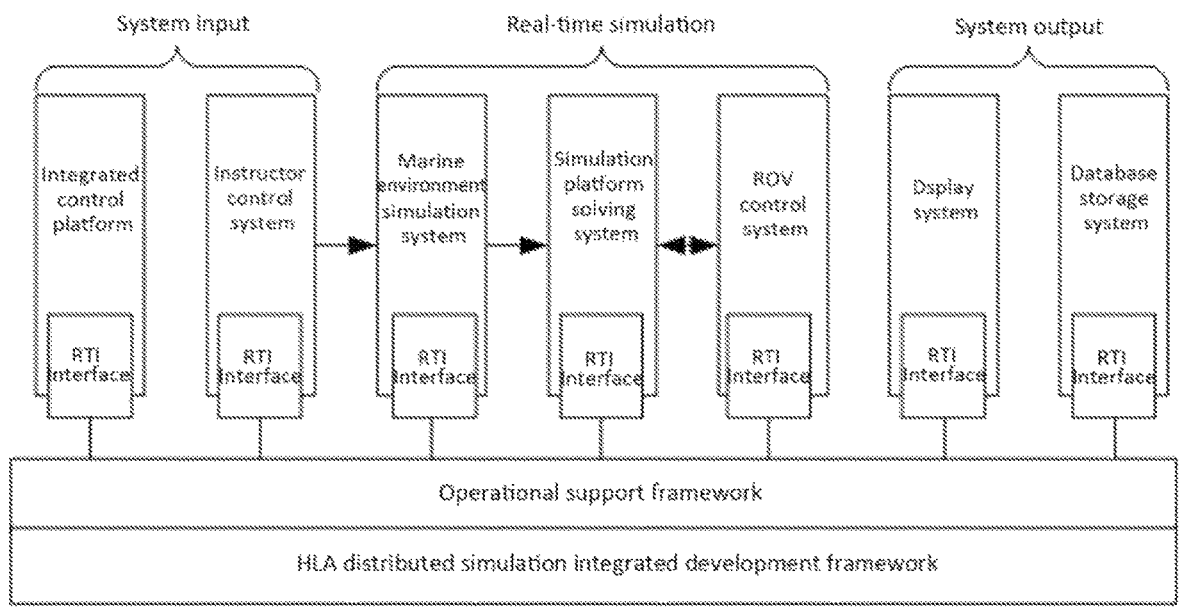
FIG. 1 is a structural diagram of a six-degree-of-freedom ROV operation simulation platform.
Figure 2:
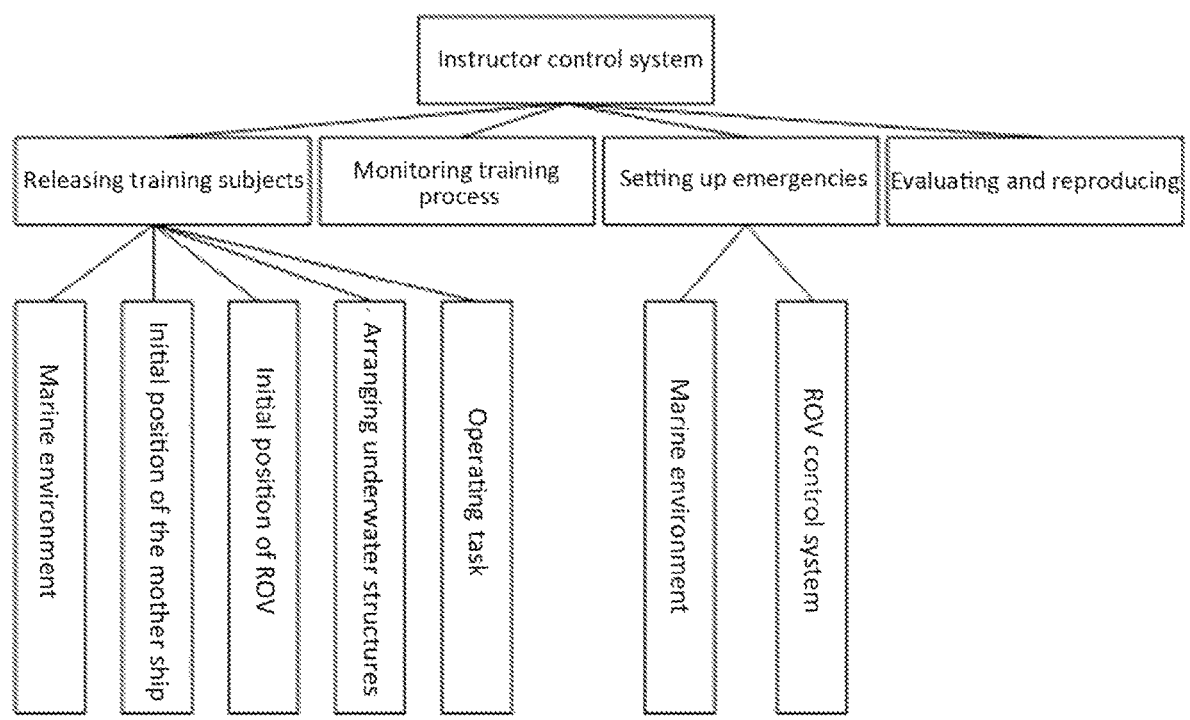
FIG. 2 is a structural diagram of an instructor control system.

Hereinafter, the present invention will be further described in conjunction with the accompanying drawings.
As shown in FIGS. 1-6, a method for constructing a six-degree-of-freedom ROV operation simulation platform comprises the following steps. At step 1: an integrated control platform starts an instructor control system, a marine environment simulation system, a simulation platform calculation system, an ROV control system and a display system through a network. Hardware operation is monitored during operation of the operation simulation platform to ensure safe and stable operation of a hardware device during an ROV operation simulation process.
At step 2, according to an instruction of an instructor, as shown in FIG. 2, the instructor control system carries out the following steps of:
1. issuing, by the instructor control system, training subjects: determining training sea area and environment comprising reference altitude, a one-hour average wind velocity and frequency at the reference altitude; a significant wave height, a characteristic period, and a direction expansion function; a water depth and a tidal current velocity; issuing initial positions and attitudes of a mother ship, an ROV, and a TMS; arranging job tasks comprising parameter settings of training scenarios, underwater man-made structures, and training time;
2. monitoring training process: when the ROV operation simulation platform is running, controlling start, pause, continuation, and end of training for an instructor to complete ROV operation simulation training;
3. setting up emergencies, comprising sudden changes in marine and atmospheric environments, device failures in the ROV operating systems;
4. evaluating and reproducing, comprising recording a training process, comprehensive evaluation of operation of a driver based on data recorded in the ROV operation simulation process, and loading the recorded training process and other operating functions.

Figure 3:
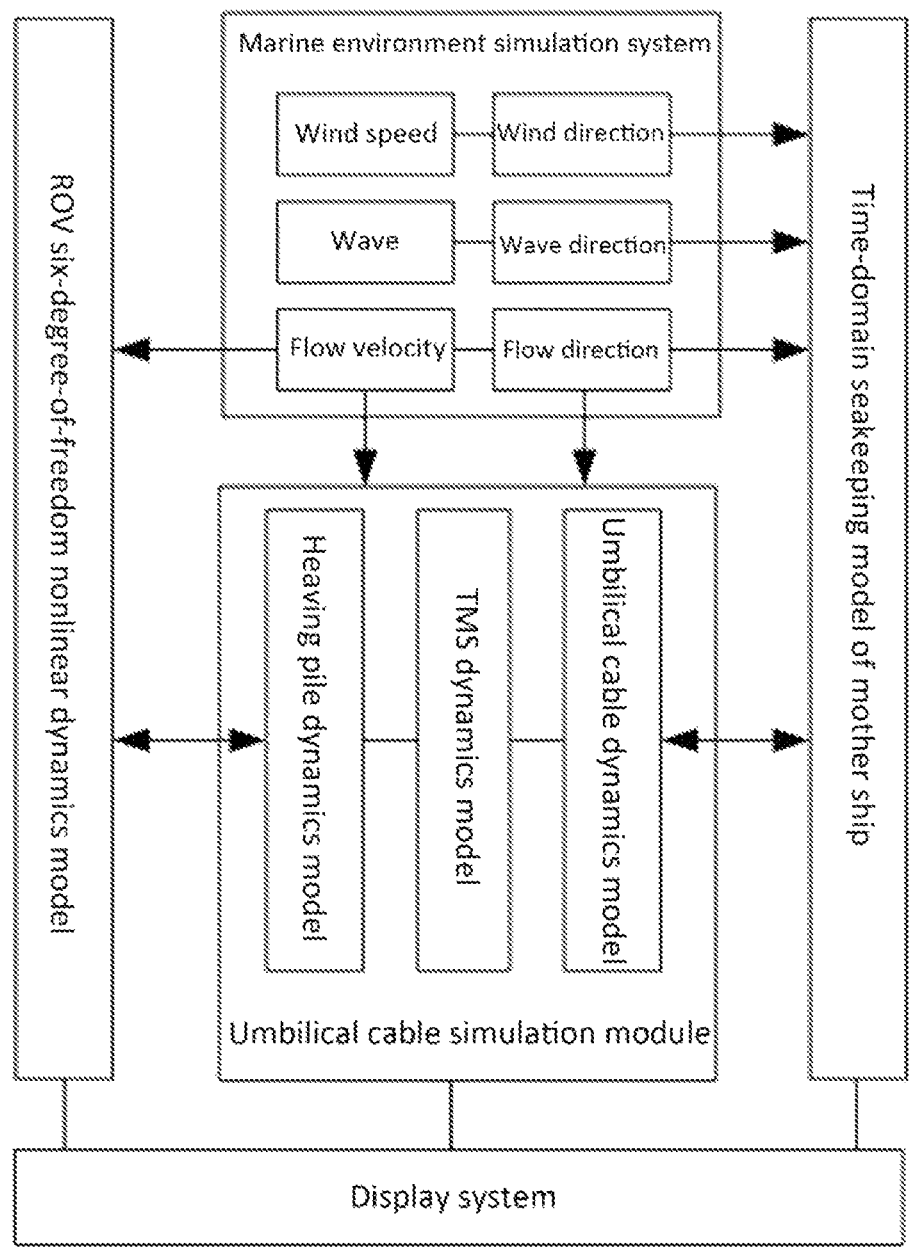
FIG. 3 is a structural diagram of a marine environment simulation system.
Figure 4:
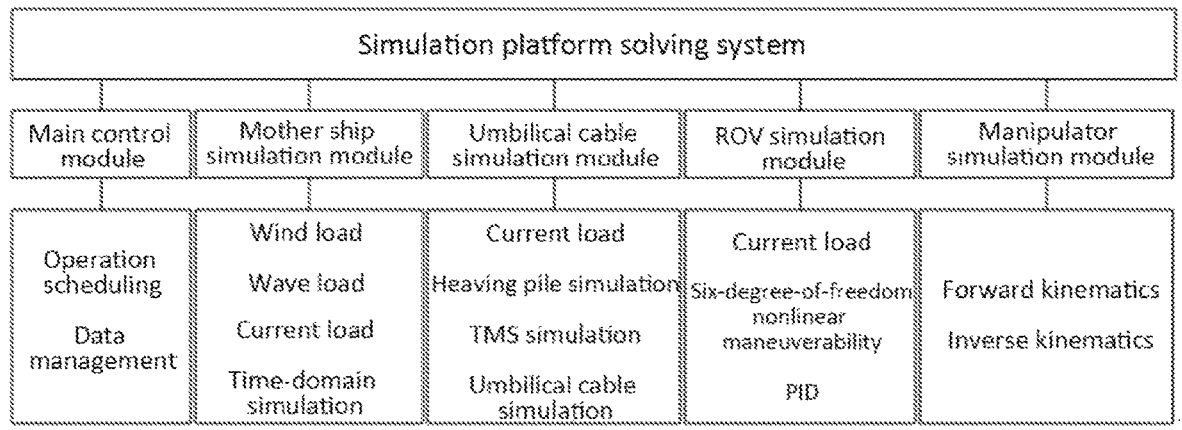
FIG. 4 is a structural diagram of a simulation platform calculation system.

At step 3, the marine environment simulation system comprises a sea wind module, a sea wave module, a sea current module, and a display module, as shown in FIG. 3, the step 3 comprises the following steps.
1. The sea wind module generates a wind spectrum and calculates a time history of a wind velocity distribution according to the reference altitude issued by the instructor control system, and the one-hour average wind velocity and frequency at the reference altitude.
2. The wave module generates a wave spectrum and a direction spectrum according to the significant wave height, the characteristic period and the direction expansion function issued by the instructor control system, and calculates the wave elevation time history.
3. The sea current module calculates a wind velocity-induced current velocity component according to the wind velocity, and calculates a current velocity distribution time history according to a water depth and a tidal current velocity issued by the instructor control system.
4. The display module creates weather effects such as sunny, rainy, and foggy days based on atmospheric and sea status data imported by the instructor control system, and simulates effects of the sun, moon, sky, light, horizon, and the like; and creates ocean effects based on data of the sea wave module, comprising undulating, and sun/moon lit ocean colors.

Figure 5:
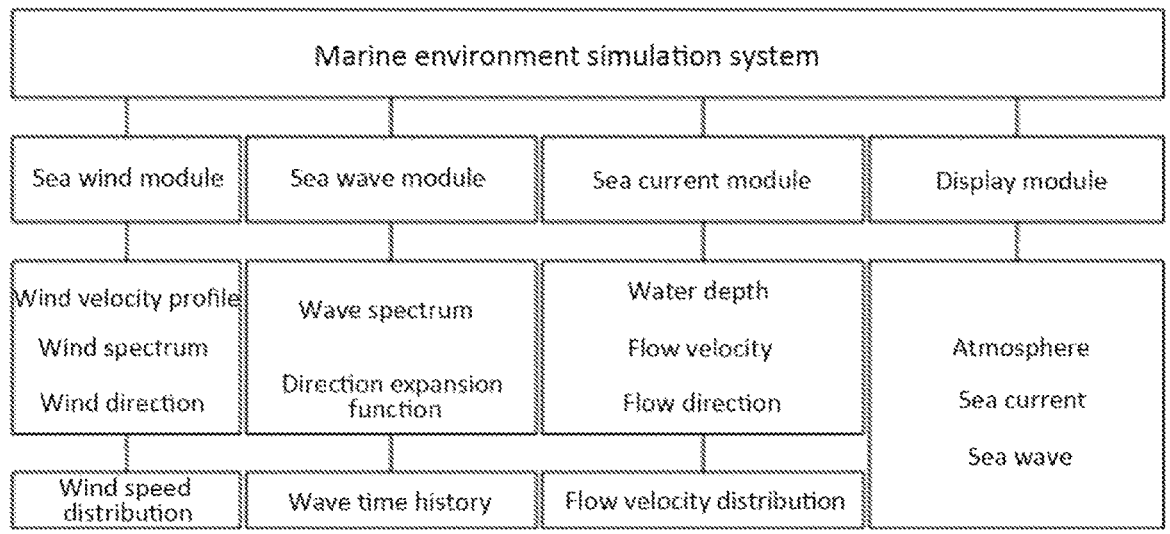
FIG. 5 shows a simulation platform coupling dynamics model.

At step 4, the calculation system of the simulation platform comprises a main control module, a mother ship simulation module, an umbilical cable simulation module, an ROV simulation module and a manipulator simulation module, and the step 4 comprises the following steps.
1. The main control module is used for operation scheduling and data management of the ROV operation simulation platform, as shown in FIG. 5; signal output terminals of the mother ship simulation module, the umbilical cable simulation module, the ROV simulation module and the manipulator simulation module are connected with a signal input terminal of the main control module for simulating attitudes and operations of the mother ship, the TMS and the ROV. The mother ship simulation module receives data from the marine environment simulation system and the umbilical cable simulation module, and calculates the motions and positions of the mother ship and the A-shape frame based on a time-domain ship seakeeping equation. The umbilical cable simulation module receives data of the sea current module, the mother ship simulation module and the ROV simulation module, calculates shapes and tensions of umbilical cables and tethers based on a beam model and a finite difference method, and calculates a pose of the repeater TMS based on a bar element model. The manipulator simulation module receives data from the ROV simulation module, and calculates a joint velocity, an acceleration and a force based on a dynamic model established by a Newton-Euler method.

2. A mathematical model of the mother ship is established:

the mother ship simulation module calculates the motion of the mother ship based on the time-domain seakeeping equation, and transformation of the velocity of the mother ship from a body-fixed coordinate system to a seakeeping coordinate system:

$$\dot{\eta} = (\bar{\xi}_0, \bar{\omega}_0)^T = J_\Theta(\eta) v_0 \qquad (1)$$

wherein, in the formula: $\dot{\eta}$ and $\eta$ are a velocity and a displacement of the mother ship in the seakeeping coordinate system, $\bar{\xi}_0$ and $\bar{\omega}_0$ are a linear velocity and an angular velocity respectively; $J_\Theta(\eta)$ is a transformation matrix of the mother ship between the seakeeping coordinate system and the body-fixed coordinate system; and $v_0$ is a mother ship velocity in the body-fixed coordinate system.

A six-degree-of-freedom dynamic model of the mother ship is established in the body-fixed coordinate system:

$$M_0 \dot{v}_0 + C_{RB0} v_0 + C_{A0} v_{r0} + D_0 v_{r0} + \int_0^t K_0(t-\gamma) [v_0(\gamma) - Ue_1] d\gamma + G_0 \eta = \tau_{wind0} + \tau_{wave0} + \tau_{cable0} \qquad (2)$$

wherein, in the formula: $M_0$ is a sum of a mass of the mother ship and an additional mass; $C_{RB0}$ and $C_{A0}$ are centripetal force and Coriolis force matrixes of a rigid body and a fluid respectively; $D_0$ is a damping matrix; and $K_0(t-\tau)$ is a time delay function, wherein t is a simulation time, $\gamma$ is an integration variable; U is a longitudinal velocity of the mother ship; $e_1$ is a longitudinal unit vector; $G_0$ is a stiffness matrix of the mother ship; $\tau_{wind0}$ is a wind load; $\tau_{wave0}$ is a wave load; $v_{r0}$ is a relative velocity of the mother ship with the sea current in the body-fixed coordinate system, and $\tau_{cable0}$ is a tension of the umbilical cables, which is marked in a direction of the seakeeping coordinate system as:

$$\tau_{cable0} = [F_{x0}, F_{y0}, F_{z0}, F_{z0} y_{f0} - F_y z_{f0}, F_0 z_{f0} - F_{z0} x_{f0}, F_{y0} x_{f0} - F_{x0} y_{f0}]^T \qquad (3)$$

wherein $F_{x0}$, $F_{y0}$, $F_{z0}$ are tensions of top ends of the umbilical cables in the direction of the seakeeping coordinate system, calculated by an umbilical cable simulation module based on a beam model, $(x_{f0}, y_{f0}, z_{f0})$ are coordinates of a top end of the A-shape frame relative to a center of gravity of the mother ship in the direction of the seakeeping coordinate system, and a linear velocity of the top end of the A-shape frame in the seakeeping coordinate system is:

$$(U_0, V_0, W_0)^T = \bar{\xi}_0 + \bar{\omega}_0 \times r \qquad (4)$$

wherein $U_0$, $V_0$, $W_0$ are respectively longitudinal, transverse and vertical velocities of the top end of the A-shape frame in the seakeeping coordinate system, r is a vector radius of the top end of the A-shape frame, and $\bar{\xi}_0$ and $\bar{\omega}_0$ are respectively linear and angular velocities of the mother ship in the body-fixed coordinate system.

3. The umbilical cable simulation module is based on the beam model, and a finite difference method is used to calculate the shapes of the umbilical cables and the tethers, the tensions at both ends of the TMS and the tension $\tau_{cable0}$ at the A-shape frame end.

(1). The beam model of the umbilical cables and the tethers is established:

$$H \frac{\partial Y}{\partial s} = P \frac{\partial Y}{\partial t} + Q \qquad (5)$$

$$Y = [\varepsilon \ S_n \ S_b \ u \ v \ w \ \varphi \ \theta \ \Omega_1 \Omega_2 \ \Omega_3]^T \qquad (6)$$

wherein, in the formula: Y is a vector consisting of a umbilical axial strain $\varepsilon$, a normal stress $S_n$, a tangential stress $S_b$, an axial velocity u, a normal velocity v, a tangential velocity w, axial and normal rotation angles $\phi$ and $\theta$ of an element, a torsion rate $\Omega_1$, a normal curvature $\Omega_2$ and a tangential curvature $\Omega_3$; s is an umbilical element length; t is a simulation time; H is a coefficient matrix related to a mass, an additional mass, a diameter, axial and normal rotation angles, a velocity and an axial strain of an umbilical element; P is a coefficient matrix related to mass, velocity and stiffness; Q is a vector related to $S_n$, $S_b$, $\Omega_1$, $\Omega_2$, $\Omega_3$ axial and normal rotation angles, a velocity, a current velocity, a resistance coefficient and a stiffness of an element.

(2) Boundary conditions of the umbilical cables and the tethers are established in a coupling model:

the top end of the umbilical cable is the mother ship, and the bottom end of the umbilical cable is the TMS, and the tension at the top and bottom ends of the umbilical cable in the direction of the seakeeping coordinate system are as follows:

$$F_{x(0,n)} = \qquad (7)$$
$$[EA\varepsilon_{(0,n)}\cos\varphi_{(0,n)}\cos\theta_{(0,n)} - S_{n(0,n)}\sin\varphi_{(0,n)} + S_{b(0,n)}\cos\varphi_{(0,n)}\sin\theta_{(0,n)}]$$

$$F_{y(0,n)} =$$
$$[EA\varepsilon_{(0,n)}\sin\varphi_{(0,n)}\cos\theta_{(0,n)} + S_{n(0,n)}\cos\varphi_{(0,n)} + S_{b(0,n)}\sin\varphi_{(0,n)}\sin\theta_{(0,n)}]$$

$$F_{z(0,n)} = [-EA\varepsilon_{(0,n)}\sin\theta_{(0,n)} + S_{b(0,n)}\cos\theta_{(0,n)}]$$

wherein $F_{x(0,n)}$, $F_{y(0,n)}$, $F_{z(0,n)}$ are longitudinal, transverse and vertical tensions of the seakeeping coordinate system respectively, E is a Young's modulus of the umbilical cables, A is a cross-sectional area of the umbilical cables, and the subscript (0, n) represents parameters of the bottom end or the top end, 0 represents the parameters of the top end and n represents the parameters of the bottom end.

The velocities at a junction of both ends of umbilical cables and the top end of the A-shape frame and TMS are consistent, and the velocities at both ends of the tethers are consistent with that of the ROV and the TMS, the velocities at both ends of the umbilical cables or the tethers in the direction of the seakeeping coordinate system are:

$$U_{t(0,n)} = (u_{(0,n)}\cos\varphi_{(0,n)}\cos\theta_{(0,n)} - v_{(0,n)}\sin\varphi_{(0,n)} + w_{(0,n)}\cos\varphi_{(0,n)}\sin\theta_{(0,n)}) \qquad (8)$$

$$V_{t(0,n)} = (u_{(0,n)}\sin\varphi_{(0,n)}\cos\theta_{(0,n)} + v_{(0,n)}\cos\varphi_{(0,n)} + w_{(0,n)}\sin\varphi_{(0,n)}\sin\theta_{(0,n)})$$

$$W_{t(0,n)} = (-u_{(0,n)}\sin\theta_{(0,n)} + w\cos\theta_{(0,n)})$$

wherein $U_{t(0,n)}$, $V_{t(0,n)}$, $W_{t(0,n)}$ are respectively longitudinal, transverse and vertical velocities in the seakeeping coordinate system, and the boundary conditions of the tethers and umbilical cables are calculated in a similar way, with the TMS and the ROV at the top end and a tail end of the tethers respectively.

(3) The finite difference model of the tethers and the umbilical cables is established:

$$(1-\alpha_h)^2 H^i Y^i \Delta t + \alpha_h(1-\alpha_h)[H^i Y^{i-1} + H^{i-1} Y^1] \Delta t + \alpha_h^2 H^{i-1} Y^{i-1} \Delta t + (1-\alpha_p)_2 P^i Y^i \Delta s + \alpha_p(1-\alpha_p) [P^i Y^{i-1} + P^{i-1} Y^i] \Delta s + \alpha_p^2 P^{i-1} Y^{i-1} \Delta s + (1-\alpha_p) Q^i \Delta s \Delta t + \alpha_p Q^{i-1} \Delta s \Delta t = 0 \qquad (9)$$

wherein, in the formula: $\alpha_h$ and $\alpha_p$ are difference coefficients; $H^i$ and $H^{i-1}$ are the coefficient matrices related to a mass, an additional mass, a diameter, axial and normal rotation angles, a velocity and an axial strain of front and rear elements and umbilical elements; $P^i$ and $P^{i-1}$ are coefficient matrices of the front and rear elements and the umbilical elements related to mass, velocity and stiffness; $Q^i$ and $Q^{i-1}$ are vectors of the front and rear elements and $S_n$, $S_p$, $\Omega_1$, $\Omega_2$, $\Omega_3$ and the axial and normal rotation angles, velocity, current velocity, drag coefficient and stiffness of the elements; $Y^i$ and $Y^{i-1}$ are vector Y of the front and rear elements; $\Delta t$ is a time step; and $\Delta s$ is a length of the elements.

(4) The hydrodynamic force of the TMS and ROV deployment is calculated based on the element model, and the dynamic model of the element model:

$$M_1\ddot{x}+C_1\dot{x}+D_{11}\dot{x}+D_{21}f(\dot{x})+K_1(x)x=q_{1r}+q_{1cable}+q_{1tether} \quad (10)$$

wherein, in the formula: $M_1$ is a sum of a TMS mass and an additional mass; $C_1$ is a centripetal force and Coriolis force matrix of the TMS; $D_{11}$ and $D_{21}$ are first-order and second-order hydrodynamic coefficients; $K_1(x)$ is a stiffness matrix of the TMS; $q_{1r}$ is a current load on the TMS; $q_{1cable}$ and $q_{1tether}$ are respectively tensions at the bottom end of the umbilical cables and the top end of the tethers, and the calculation method is consistent with formula (7); $x$ is a displacement of the TMS; $\dot{x}$ is a velocity of the TMS; $\ddot{x}$ is an acceleration of the TMS; $t$ is a simulation time; a hydrodynamic coefficient of a bar element is determined according to a form of a structure and a shielding relationship, taking into account hydrodynamic characteristics dependent on a depth change. Compared with the time-domain simulation method with fixed hydrodynamic coefficients, the model takes into account the interaction between the TMS and ROV structures and the influence of immersion depth, and more accurately calculates the hydrodynamic forces of the TMS and the ROV passing through a free liquid surface.

4. The ROV simulation module calculates the motion of the ROV based on a nonlinear asymmetric maneuverability equation, and a six-degree-of-freedom ROV dynamics model:

$$M_{RB2}\dot{v}_2+C_{RB2}(v_2)v_2+M_{A2}\dot{v}_{r2}+N_2(v_{r2})+g_2=\tau_{2thrust}+\tau_{2ether}+\tau_{2manipulator} \quad (11)$$

wherein, in the formula: $M_{RB2}$ is a mass matrix of the ROV; $C_{RB2}$ is a centripetal force and Coriolis force matrix of the ROV; $M_{A2}$ is an additional mass matrix of the ROV, comprising main diagonal and off-diagonal additional mass and additional moment of inertia, a total of 36; $N_2$ is a drag coefficient matrix; $g_2$ is a restoring force matrix; $\tau_{2thrust}$ is a thrust of a thruster; $\tau_{2tether}$ is a tension of the tethers, and the calculation method is consistent with formula (7); $v_2$ is a velocity of the ROV; $\dot{v}_2$ is an acceleration; $v_{r2}$ is a velocity of the ROV relative to the sea current; $\dot{v}_{r2}$ is a relative acceleration;

expression of $N_2$ is an asymmetrical hydrodynamic force, specifically:

$$N_2=F_{vv}v_{r2}^2+F_{v|v|}v_{r2}|v_{r2}| \quad (12)$$

wherein $F_{vv}$ and $F_{v|v|}$ are respectively second-order symmetric and asymmetric hydrodynamic coefficients.

5. Forward kinematics of the manipulator simulation module comprises finding a roll angle of the manipulator in the case of a given linear motion, using a Denavit-Hartenberg symbol to establish generalized coordinates of the kinematic model, and calculating through a Newton iterative method; the inverse kinematics comprises given a rolling angle of a connecting rod to find a linear motion of a tail end; and a nonlinear dynamic model of the connecting rod of the manipulator is:

$$M_i\ddot{q}_i+C_i\dot{q}_i+G_i(q_i)+\tau_{Di}=\tau_i \quad (13)$$

wherein, in the formula: $M_i$ is an additional mass matrix of the connecting rod i; $C_i$ is a fluid centripetal force and Coriolis force matrix of the connecting rod i; $G_i(q_i)$ is a restoring force matrix of the connecting rod i; $\tau_{Di}$ is a damping of the connecting rod i; $\tau_i$ is a driving force of the manipulator; $\ddot{q}_i$, $\dot{q}_i$, $q_i$ are an angular acceleration, an angular velocity and a rotation angle of the connecting rod i respectively, the boundary conditions of the manipulator are that velocities of a base and the end of the ROV are equal, and a force on the ROV by the base n of the manipulator is:

$$\tau_{2manipulator}=\tau_n=\sum_{j=1}^{n}M_{nj}\ddot{q}_j+\sum_{j=1}^{n}\sum_{k=1}^{n}C_{njk}\dot{q}_j\dot{q}_k+\sum_{j=1}^{n}\tau_{Dj} \quad (14)$$

wherein, characters in the formula have the same meanings as those in formula (13), and the subscripts j and k respectively represent the j-th and k-th connecting rods.

Figure 6:
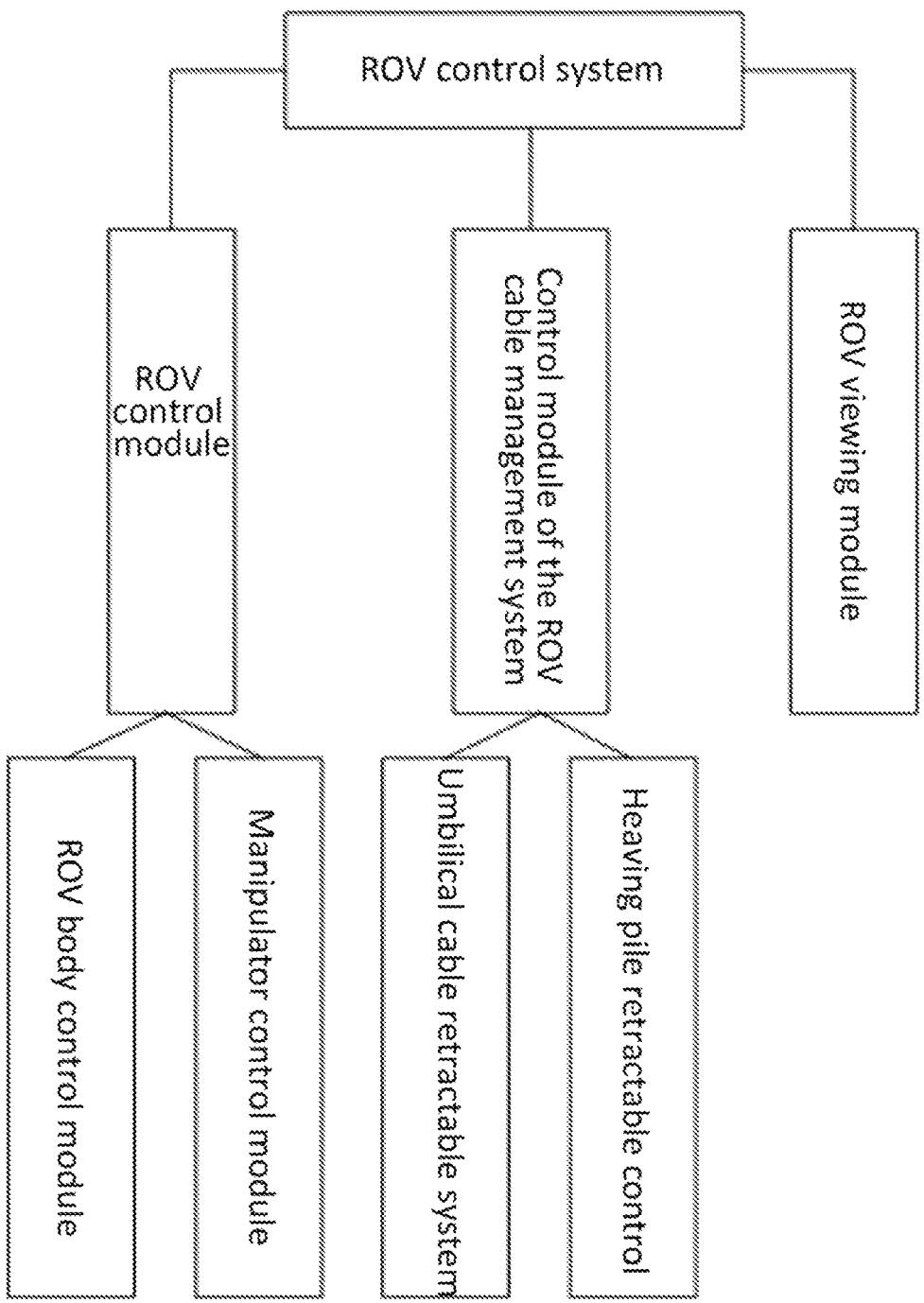
FIG. 6 is a structural diagram of a ROV control system.

At step 5, the ROV control system, as shown in FIG. 6, comprises the ROV control module, the control module of the ROV cable management system, and the ROV viewing module. The ROV control module comprises an ROV body control module and a manipulator control module to respectively control motion of the ROV and the manipulator; the control module of the ROV cable management system comprises an umbilical cable retractable system and a tether retractable control, respectively controlling retractable activities of the A-shape frame and the TMS; and the ROV control system solves digital input and output signals and analog input signals into corresponding engineering quantities through A system processor, and realizes interactive simulation between man and device.

In order to verify the validity and effects of the method of the present invention, an example is given to illustrate, wherein the example comprises the following steps.

1. The integrated control platform is manually started, and the instructor control system, the marine environment simulation system, the simulation platform calculation system, the ROV control system and the display system are remotely started through a network, it is checked whether software and hardware of each system are running stably, and a working process of the simulation platform is continuously tested.

2. After the system is started, the instructor operates the instructor control system to input atmospheric and marine environments of the ROV operating sea area, determine the initial positions and attitudes of the mother ship, the ROV and the TMS, and arrange operational tasks comprising parameter settings for training scenarios, underwater man-made structures, and training time, then start to run the ROV operation simulation platform, combined with the display system to monitor the ROV simulation training process. During the ROV operation simulation process, the instructor can pause, continue, and end the simulation as needed, or set up emergencies such as sudden changes in the ocean and atmospheric environment, and device failures in the ROV operation system.

3. According to the instructions of the instructor, the sea wind module establishes the wind field, waves, and currents of the ROV operating sea area through the wave module, and the sea current module, and obtains a wind velocity distribution time history, a wave elevation time history, and a current velocity distribution time history, and the data are transmitted to a response module in the simulation platform calculation system. The display module creates weather effects such as sunny, rainy, and foggy days based on the atmospheric and sea status data imported from the instructor control system, and simulates effects of the sun, moon, sky, light, horizon, and the like; and creates ocean effects comprising wave surfaces, undulating, and sun/moon lit sea colors based on the data of the wave module.

4. The mother ship simulation module, the umbilical cable simulation module, the ROV simulation module, and the manipulator simulation module in the simulation platform calculation system receive initial simulation information released by the instructor, and combine the environmental data calculated by the sea wind module to calculate the motion of the mother ship based on the time-domain seakeeping equation, calculate the shapes and the tensions of the umbilical cables and the tethers and the motion of the TMS based on the beam model and the element model, calculate the motion of the ROV based on the nonlinear asymmetric maneuverability equation, and calculate the motion of the manipulator based on the dynamic model based on the Newton-Euler method. The main control module schedules the operation of other modules and manages the data to transfer between the modules.

5. After the instructor issues an instruction to start simulation, the driver controls the A-shape frame to release the umbilical cables through the ROV control system and the umbilical cable retraction system. After the ROV and the TMS reach a predetermined depth of the task, the driver uses the ROV body control module and the tether retraction control module to control the motion of the ROV and the TMS to release tethers. When the ROV reaches a vicinity of the underwater target, the driver uses the manipulator control module to control the motion of the manipulator to complete the underwater operation. After the task is completed, the driver retrieves the tethers, the ROV and the TMS through the ROV control system. During the simulation process, the driver observes the surrounding environment of the ROV through the ROV visual module.

6. The instructor finishes the operation simulation, and uses the operation process recorded by the instructor control system to conduct a comprehensive evaluation of the operation of the driver, or perform operations such as loading the recorded training process.

7. After ending of training and evaluation, the integrated control platform closes all systems, and usage of the entire simulation platform is completed.

The present invention can arbitrarily match various operating tasks under different environments and operating objects according to ROV underwater operation training requirements, and restore the actual operating effects of the ROV, the TMS, the mother ship, the tethers and the umbilical cables in underwater operations as much as possible, so that the drivers can get a better sense of driving substitution.

The above is only a preferred embodiment of the present invention, it should be pointed out that for those of ordinary skills in the art, without departing from the principle of the present invention, some improvements and modifications can also be made, and these improvements and modifications should be regarded as falling into the protection scope of the present invention.

What is claimed is:

1. A method for constructing a six-degree-of-freedom ROV (Remoted operated vehicle) operation simulation platform, wherein the simulation platform comprises four parts: an HLA distributed integrated development framework, a system input module, a real-time simulation module and a system output module, the system input module comprises an integrated control platform and an instructor control system, the real-time simulation module comprises a marine environment simulation system, a simulation platform calculation system and an ROV control system, and the system output module comprises a display system; and each system provides various services described in an interface specification through a run-time infrastructure (RTI) responsible for communication between the systems to achieve interoperability, wherein:

the integrated control platform starts the instructor control system, the marine environment simulation system, the simulation platform calculation system, the ROV control system and the display system through a network; the instructor control system issues training subjects, intervenes in parameters of a simulation platform device and an operating system during training, sets faults and emergencies, and arranges positions;

the marine environment simulation system releases a sea current, sea wave and sea wind environment, and sets marine environment conditions which are capable of being input to the display system;

the simulation platform calculation system receives data of the instructor control system and the marine environment simulation system, simulates motions of the mother ship and an A-shape frame at sea, and solves shapes and tensions of the umbilical cables;

receiving data of the ROV control system and calculating the ROV six-degree-of-freedom motion and manipulator motion; the simulation platform calculation system is input into the display system to carry out third perspective display and ROV visual display of the operating system respectively;

the ROV control system is in network communication with the simulation platform calculation system, and is used for collecting operations and instructions of operators, and displaying the pose of the ROV and monitor visual scene; and the display system receives data of the simulation platform calculation system, and is used for displaying third perspective of the mother ship, the umbilical cables, the ROV, manipulator operation status and marine environment;

wherein the method comprises the following steps of:

step 1: calculating a hydrodynamic coefficient and a time delay function of a mother ship according to a profile of the mother ship, and establishing a time domain motion equation according to a layout of the mother ship and a position of the A-shape frame, $$M_0 \dot{v}_0 + C_{RB0} v_0 + C_{A0} v_{r0} + D_0 v_{r0} + \int_0^t K_0(t-\gamma)[v_0(\gamma) - Ue_1]d\gamma + G_0 \eta = \tag{1}$$

$$\tau_{wind0} + \tau_{wave0} + \tau_{cable0}$$

wherein, in the formula: $M_0$ is a sum of a mass of the mother ship and an additional mass; $C_{RB0}$ and $C_{A0}$ are centripetal force and Coriolis force matrixes of a rigid body and a fluid respectively; $D_0$ is a damping matrix; and $K_0(t-\tau)$ is the time delay function, wherein t is a simulation time, $\gamma$ is an integration variable; U is a longitudinal velocity of the mother ship; $e_1$ is a longitudinal unit vector; $G_0$ is a stiffness matrix of the mother ship; $\tau_{wind0}$ is a wind load; $\tau_{wave0}$ is a wave load; $v_{r0}$ is a relative velocity of the mother ship with a sea current in a body-fixed coordinate system, and $\tau_{cable0}$ is a tension of the umbilical cables, which is marked in a direction of a seakeeping coordinate system as:

$$\tau_{cable0}=[F_{x0},F_{y0},F_{z0},F_{z0}y_{f0}-F_{y0}z_{f0},F_{0}z_{f0}-F_{z0}x_{f0},F_{y0}x_{f0}-F_{x0}y_{f0}]^T \quad (2)$$

wherein $F_{x0}$, $F_{y0}$, $F_{z0}$ are tensions of top ends of the umbilical cables in the direction of the seakeeping coordinate system, calculated by an umbilical cable simulation module based on a beam model, $(x_{f0}, y_{f0}, z_{f0})$ are coordinates of a top end of the A-shape frame relative to a center of gravity of the mother ship in the direction of the seakeeping coordinate system, and a linear velocity of the top end of the A-shape frame in the seakeeping coordinate system is:

$$(U_0, V_0, W_0)^T = \xi_0 + \overline{\omega}_0 \times r \quad (3)$$

wherein $U_0$, $V_0$, $W_0$ are respectively longitudinal, transverse and vertical velocities of the top end of the A-shape frame in the seakeeping coordinate system, r is a vector radius of the top end of the A-shape frame, and $\xi_0$ and $\overline{\omega}_0$ are respectively linear and angular velocities of the mother ship in the body-fixed coordinate system;

step 2: establishing a finite difference model of the umbilical cables and the tethers by adopting the beam model, and calculating a shape and tensions at both ends:

creating the beam model of the umbilical cables and the tethers:

$$H\frac{\partial Y}{\partial s} = P\frac{\partial Y}{\partial t} + Q \quad (4)$$

$$Y = [\varepsilon \ S_n \ S_b \ u \ v \ w \ \varphi \ \theta \ \Omega_1 \Omega_2 \ \Omega_3]^T \quad (5)$$

wherein, in the formula: Y is a vector consisting of a umbilical axial strain $\varepsilon$, a normal stress $S_n$, a tangential stress $S_b$, an axial velocity u, a normal velocity v, a tangential velocity w, axial and normal rotation angles $\phi$ and $\theta$ of an element, a torsion rate $\Omega_1$, a normal curvature $\Omega_2$ and a tangential curvature $\Omega_3$; s is an umbilical element length; t is a simulation time; H is a coefficient matrix related to a mass, an additional mass, a diameter, axial and normal rotation angles, a velocity and an axial strain of an umbilical element; P is a coefficient matrix related to mass, velocity and stiffness; Q is a vector related to $S_n$, $S_b$, $\Omega_0$, $\Omega_2$, $\Omega_3$, axial and normal rotation angles, a velocity, a current velocity, a resistance coefficient and a stiffness of an element;

step 3: establishing boundary conditions of the umbilical cables and the tethers in a coupling model:
1) the umbilical cables and the tethers are connected with the mother ship, a TMS (tether management systems) and the ROV, and in the direction of the seakeeping coordinate system, the tensions on the top ends of the umbilical cables or the tethers on the mother ship, the TMS and the ROV are:

$$F_{x(0,n)} = \quad (6)$$
$$[EA\varepsilon_{(0,n)}\cos\varphi_{(0,n)}\cos\theta_{(0,n)} - S_{n(0,n)}\sin\varphi_{(0,n)} + S_{b(0,n)}\cos\varphi_{(0,n)}\sin\theta_{(0,n)}]$$

$$F_{y(0,n)} =$$
$$[EA\varepsilon_{(0,n)}\sin\varphi_{(0,n)}\cos\theta_{(0,n)} + S_{n(0,n)}\cos\varphi_{(0,n)} + S_{b(0,n)}\sin\varphi_{(0,n)}\sin\theta_{(0,n)}]$$

$$F_{z(0,n)} = [-EA\varepsilon_{(0,n)}\sin\theta_{(0,n)} + S_{b(0,n)}\cos\theta_{(0,n)}]$$

wherein $F_{x(0,n)}$, $F_{y(0,n)}$, $F_{z(0,n)}$ are longitudinal, transverse and vertical tensions of the seakeeping coordinate system respectively, E is a Young's modulus of the umbilical cables, A is a cross-sectional area of the umbilical cables, and the subscript (0, n) represents parameters of a bottom end or the top end, 0 represents the parameters of the top end and n represents the parameters of the bottom end;

2) the velocities at a junction of both ends of umbilical cables and the top end of the A-shape frame and the TMS are consistent, and the velocities at both ends of the tethers are consistent with that of the ROV and the TMS, and the velocities at both ends of the umbilical cables or the tethers in the direction of seakeeping coordinate system are:

$$U_{t(0,n)} = (u_{(0,n)}\cos\varphi_{(0,n)}\cos\theta_{(0,n)} - v_{(0,n)}\sin\varphi_{(0,n)} + w_{(0,n)}\cos\varphi_{(0,n)}\sin\theta_{(0,n)}) \quad (7)$$

$$V_{t(0,n)} = (u_{(0,n)}\sin\varphi_{(0,n)}\cos\theta_{(0,n)} + v_{(0,n)}\cos\varphi_{(0,n)} + w_{(0,n)}\sin\varphi_{(0,n)}\sin\theta_{(0,n)})$$

$$W_{t(0,n)} = (-u_{(0,n)}\sin\theta_{(0,n)} + w\cos\theta_{(0,n)})$$

wherein $U_{t(0,n)}$, $V_{t(0,n)}$, $W_{t(0,n)}$ are respectively longitudinal, transverse and vertical velocities in the seakeeping coordinate system, and the boundary conditions of the tethers and umbilical cables are calculated in a similar way, with the TMS and the ROV at the top end and a tail end of the tethers respectively;

3) Establishing the finite difference model of the tethers and the umbilical cables:

$$(1-\alpha_h)^2 H^i Y^i \Delta t + \alpha_h (1-\alpha_h)[H_i Y^{i-1} + H^{i-1} Y^i]\Delta t + \alpha_h^2 H^{i-1} Y^{i-1} \Delta t + (1-\alpha_p)^2 P^i Y^i \Delta s + \alpha_p(1-\alpha_p) [P^i Y^{i-1} + P^{i-1} Y^i]\Delta s + \alpha_p^2 P^{i-1} Y^{i-1} \Delta s + (1-\alpha_p) Q^i \Delta s \Delta t + \alpha_p Q^{i-1} \Delta s \Delta t = 0 \quad (8)$$

wherein, in the formula: $\alpha_h$ and $\alpha_p$ are difference coefficients; $H^i$ and $H^{i-1}$ are coefficient matrices related to a mass, an additional mass, a diameter, axial and normal rotation angles, a velocity and an axial strain of front and rear elements and umbilical elements; $P^i$ and $P^{i-1}$ are coefficient matrices of the front and rear elements and the umbilical elements related to mass, velocity and stiffness; $Q^i$ and $Q^{i-1}$ are vectors of the front and rear elements and $S_n$, $S_b$, $\Omega_1$, $\Omega_2$, $\Omega_3$ and the axial and normal rotation angles, velocity, current velocity, drag coefficient and stiffness of the elements; $Y^i$ and $Y^{i-1}$ are vector Y of the front and rear elements; $\Delta t$ is a time step; and $\Delta s$ is a length of the elements;

step 4: calculating a hydrodynamic force of a TMS and ROV deployment based on an element model, and a dynamic model of the element model:

$$M_1 \ddot{x} + C_1 \dot{x} + D_{11} \dot{x} + D_{2i} f(\dot{x}) + K_1(x)x = q_{1r} + q_{1cable} + q_{1tether} \quad (9)$$

wherein, in the formula: $M_1$ is a sum of a TMS mass and an additional mass; $C_1$ is a centripetal force and Coriolis force matrix of the TMS; $D_{11}$ and $D_{21}$ are first-order and second-order hydrodynamic coefficients; $K_1(x)$ is a stiffness matrix of the TMS; $q_{1r}$ is a current load on the TMS; $q_{1cable}$ and $q_{1tether}$ are respectively tensions at the bottom end of the umbilical cables and the top end of the tethers, and the calculation method is consistent with formula (7); x is a displacement of the TMS; $\dot{x}$ is a velocity of the TMS; $\ddot{x}$ is an acceleration of the TMS; t is a simulation time; a hydrodynamic coefficient of a bar element is determined according to a form of a structure and a shielding relationship, taking into account hydrodynamic characteristics dependent on a depth change;

step 5: establishing a nonlinear ROV maneuverability equation, considering influence of the tether tension and the manipulator:

$$M_{RB2}\dot{v}_2 + C_{RB2}(v_2)v_2 + M_{A2}\dot{v}_{r2} + N_2(v_{r2}) + g_2 = \tau_{2thrust} + \tau_{2tether} + \tau_{2manipulator} \quad (10)$$

wherein, in the formula: $M_{RB2}$ is a mass matrix of the ROV; $C_{RB2}$ is a centripetal force and Coriolis force matrix of the ROV; $M_{A2}$ is an additional mass matrix of the ROV, comprising main diagonal and off-diagonal additional mass and additional moment of inertia, a total of 36; $N_2$ is a drag coefficient matrix; $g_2$ is a restoring force matrix; $\tau_{2thrust}$ is a thrust of a thruster; $\tau_{2tether}$ is a tension of the tethers, and the calculation method is consistent with formula (7); $v_2$ is a velocity of the ROV; $\dot{v}_2$ is an acceleration; $v_{r2}$ is a velocity of the ROV relative to the sea current; and $\dot{v}_{r2}$ is a relative acceleration; expression of $N_2$ is an asymmetrical hydrodynamic force, specifically:

$$N_2 = F_{vv}v_{r2}^2 + F_{v|v|}v_{r2}|v_{r2}| \quad (11)$$

wherein $F_{vv}$ and $F_{v|v|}$ are respectively second-order symmetric and asymmetric hydrodynamic coefficients; and step 6: establishing a dynamic model of the manipulator considering the pose of the ROV:

wherein, forward kinematics of the manipulator simulation module comprises finding a roll angle of the manipulator in the case of a given linear motion, using a Denavit-Hartenberg symbol to establish generalized coordinates of the kinematic model, and calculating through a Newton iterative method; the inverse kinematics comprises giving a rolling angle of a connecting rod to find a linear motion of a tail end; and a nonlinear dynamic model of the connecting rod of the manipulator is:

$$M_i\ddot{q}_i + C_i\dot{q}_i + G_i(q_i) + \tau_{Di} = \tau_i \quad (12)$$

wherein, in the formula: $M_i$ is an additional mass matrix of the connecting rod i; $C_i$ is a fluid centripetal force and Coriolis force matrix of the connecting rod i; $G_i(q_i)$ is a restoring force matrix of the connecting rod i; $\tau_{Di}$ is a damping of the connecting rod i; $\tau_i$ is a driving force of the manipulator; $\ddot{q}_i$, $\dot{q}_i$, $q_i$ are an angular acceleration, an angular velocity and a rotation angle of the connecting rod i respectively, the boundary conditions of the manipulator are that velocities of a base and the end of the ROV are equal, and a force on the ROV by the base n of the manipulator is:

$$\tau_{2manipulator} = \tau_n = \sum_{j=1}^{n} M_{nj}\ddot{q}_j + \sum_{j=1}^{n}\sum_{k=1}^{n} C_{njk}\dot{q}_j\dot{q}_k + \sum_{j=1}^{n} \tau_{Dj} \quad (13)$$

wherein, characters in the formula have the same meanings as those in formula (13), and the subscripts j and k respectively represent j-th and k-th connecting rods.

2. The method for constructing the six-degree-of-freedom ROV operation simulation platform according to claim 1, wherein the calculation system of the simulation platform comprises a main control module, a mother ship simulation module, an umbilical cable simulation module, an ROV simulation module and a manipulator simulation module, wherein:

the mother ship simulation module receives data from the marine environment simulation system and the umbilical cable simulation module, and calculates motions and positions of the mother ship and the A-shape frame based on the time-domain ship seakeeping equation;

the umbilical cable simulation module receives data of the sea current module, the mother ship simulation module and the ROV simulation module, calculates a shape and a tension of the umbilical cables and the tethers based on the beam model and the finite difference method, and calculates a pose of the repeater TMS based on the element model; and the manipulator simulation module receives data from the ROV simulation module, and calculates a joint velocity, an acceleration and a force based on a dynamic model established by a Newton-Euler method.

3. The method for constructing the six-degree-of-freedom ROV operation simulation platform according to claim 1, wherein the ROV control system comprises an ROV control module, a control module of an ROV cable management system and an ROV viewing module, wherein:

the ROV control module comprises an ROV body control module and a manipulator control module to respectively control motions of the ROV and the manipulator;

the control module of the ROV cable management system comprises an umbilical cable retractable system and a tether retractable control, respectively controlling retractable activities of the A-shape frame and the TMS; and the ROV control system solves digital input and output signals and analog input signals into corresponding engineering quantities through a system processor, and realizes interactive simulation between man and device.

* * * * *